United States Patent
Lee et al.

(10) Patent No.: US 11,908,727 B2
(45) Date of Patent: Feb. 20, 2024

(54) SUPPORT SUBSTRATES, METHODS OF FABRICATING SEMICONDUCTOR PACKAGES USING THE SAME, AND METHODS OF FABRICATING ELECTRONIC DEVICES USING THE SAME

(71) Applicant: SAMSUNG ELECTRONICS CO., LTD., Suwon-si (KR)

(72) Inventors: Kunsil Lee, Hwaseong-si (KR); Seung Hwan Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 17/671,022

(22) Filed: Feb. 14, 2022

(65) Prior Publication Data

US 2022/0165603 A1 May 26, 2022

Related U.S. Application Data

(63) Continuation of application No. 17/060,800, filed on Oct. 1, 2020, now Pat. No. 11,631,608, which is a (Continued)

(30) Foreign Application Priority Data

Sep. 21, 2017 (KR) .................. 10-2017-0122015

(51) Int. Cl.
*H01L 21/683* (2006.01)
*H01L 21/56* (2006.01)
(Continued)

(52) U.S. Cl.
CPC ........ *H01L 21/6835* (2013.01); *H01L 21/568* (2013.01); *H01L 21/78* (2013.01);
(Continued)

(58) Field of Classification Search
CPC ............ H01L 21/6875; H01L 21/6831; H01L 21/6833; H01L 21/6835; H01L 23/544
See application file for complete search history.

(56) References Cited

U.S. PATENT DOCUMENTS 5,160,403 A    11/1992  Fisher et al.
5,268,065 A    12/1993  Grupen-Shemansky
(Continued)

FOREIGN PATENT DOCUMENTS

CN    102130019 A    7/2011
CN    102194716 A    9/2011
(Continued)

OTHER PUBLICATIONS

Communication dated Aug. 17, 2022 by the United States Patent and Trademark Office for U.S. Appl. No. 17/060,800.

*Primary Examiner* — Jaehwan Oh
*Assistant Examiner* — John M Parker
(74) *Attorney, Agent, or Firm* — Sughrue Mion, PLLC

(57) ABSTRACT

Disclosed are support substrates, methods of fabricating semiconductor packages using the same, and methods of fabricating electronic devices using the same. The support substrate comprises a main body, and a plurality of first protrusions finely protruding from an upper surface of the main body. The main body and the first protrusions include the same material and are formed as a unitary structure. The first protrusions are spaced apart from each other in first and second directions intersecting each other, when viewed in plan.

20 Claims, 14 Drawing Sheets

Related U.S. Application Data continuation of application No. 15/964,294, filed on Apr. 27, 2018, now Pat. No. 10,825,710.

(51) Int. Cl.
  *H01L 23/544* (2006.01)
  *H01L 23/31* (2006.01)
  *H01L 21/78* (2006.01)

(52) U.S. Cl.
  CPC ........ *H01L 23/3121* (2013.01); *H01L 23/544* (2013.01); *H01L 2221/68381* (2013.01); *H01L 2223/54433* (2013.01)

(56) References Cited

U.S. PATENT DOCUMENTS

| | | | |
|---|---|---|---|
| 7,811,272 | B2 | 10/2010 | Lindsay et al. |
| 8,673,690 | B2 | 3/2014 | Iijima |
| 8,792,085 | B2 | 7/2014 | Puyt et al. |
| 9,136,172 | B2 | 9/2015 | Tani et al. |
| 9,406,539 | B2 | 8/2016 | Hiroki |
| 10,355,166 | B2 | 7/2019 | Jeung et al. |
| 2005/0133935 | A1 | 6/2005 | Vasishta et al. |
| 2009/0085186 | A1 | 4/2009 | Meyer |
| 2009/0130372 | A1* | 5/2009 | Fukui ............... F16B 2/005 428/92 |
| 2010/0289283 | A1 | 11/2010 | Watanabe et al. |
| 2010/0296073 | A1 | 11/2010 | Puyt et al. |
| 2013/0218262 | A1 | 8/2013 | Ishii et al. |
| 2014/0151332 | A1 | 6/2014 | Fukasawa |
| 2016/0017196 | A1 | 1/2016 | Moore et al. |
| 2016/0325950 | A1 | 11/2016 | Urrutia Nebreda et al. |
| 2017/0018452 | A1 | 1/2017 | Dou et al. |
| 2017/0207193 | A1* | 7/2017 | Bower ............... B41F 16/0073 |
| 2018/0047546 | A1 | 2/2018 | Zhang et al. |
| 2018/0182615 | A1 | 6/2018 | Okuno |
| 2018/0182914 | A1 | 6/2018 | Okuno |

FOREIGN PATENT DOCUMENTS

| | | |
|---|---|---|
| CN | 102958473 A | 3/2013 |
| JP | 2002-208613 A | 7/2002 |
| JP | 2003-152126 A | 5/2003 |
| JP | 2007-067348 A | 3/2007 |
| JP | 2007-083376 A | 4/2007 |
| JP | 2009-054628 A | 3/2009 |
| JP | 4450766 B2 | 4/2010 |
| JP | 2013-168541 A | 8/2013 |
| JP | 5398164 B2 | 1/2014 |
| JP | 2017-057341 A | 3/2017 |
| KR | 20-0152649 Y1 | 7/1997 |
| KR | 1020010042822 A | 5/2001 |
| KR | 10-2009-0080084 A | 7/2009 |
| KR | 10-2011-0136240 A | 12/2011 |
| KR | 10-1754528 B1 | 7/2017 |

\* cited by examiner

SUPPORT SUBSTRATES, METHODS OF FABRICATING SEMICONDUCTOR PACKAGES USING THE SAME, AND METHODS OF FABRICATING ELECTRONIC DEVICES USING THE SAME

CROSS-REFERENCE TO RELATED APPLICATION

This is a Continuation of U.S. application Ser. No. 17/060,800, filed Oct. 1, 2020, which is a Continuation of U.S. application Ser. No. 15/964,294, filed Apr. 27, 2018, now issued as U.S. Pat. No. 10,825,710 on Nov. 3, 2020, which is a U.S. nonprovisional patent application claiming priority under 35 U.S.C. § 119 of Korean Patent Application No. 10-2017-0122015 filed on Sep. 21, 2017, the entire contents of which are hereby incorporated by reference.

FIELD

Inventive concepts relate to a support substrate, a method of fabricating a semiconductor package using the same, and a method of fabricating an electronic device using the same.

BACKGROUND

Semiconductor devices are beneficial in electronic industry because of their small size, multi-functionality, and/or low fabrication cost. Semiconductor devices have increasingly integrated with the development of electronic industry. Thus, semiconductor packages decrease in thickness as well as horizontal size. As package substrates included in the semiconductor packages become thinner, the probability of occurrence of defects increases due to warpage of the package substrate or the like during manufacturing processes.

SUMMARY

Some embodiments of inventive concepts provide a support substrate capable of not only reducing process defects but simplifying processes in manufacturing an electronic device.

Some embodiments of inventive concepts provide a method of fabricating a semiconductor package capable of simplifying processes as well as reducing process defects.

Some embodiments of inventive concepts provide a method of fabricating an electronic device capable of reducing process defects and simplifying processes as well.

According to exemplary embodiments of inventive concepts, a support substrate may comprise: a main body; and a plurality of first protrusions protruding from an upper surface of the main body. The main body and the first protrusions may include the same material and may be formed as a unitary structure. In a plan view, the first protrusions may be spaced apart from each other in first and second directions, the first and second directions intersecting each other.

According to exemplary embodiments of inventive concepts, a method of fabricating a semiconductor package may comprise: providing a support substrate including a main body and a plurality of first protrusions protruding from an upper surface of the main body, wherein the main body and the first protrusions may include the same material and may be formed as a unitary structure, and wherein, in a plan view, the first protrusions may be spaced apart from each other in first and second directions, the first and second directions intersecting each other; placing a package substrate on the support substrate; mounting a plurality of semiconductor chips on the package substrate; forming a mold layer covering the plurality of semiconductor chips and the package substrate; and separating the support substrate from the package substrate.

According to exemplary embodiments of inventive concepts, a method of fabricating an electronic device may comprise: providing a support substrate including a main body and a plurality of first protrusions protruding from an upper surface of the main body, wherein the main body and the first protrusions may include the same material and may be formed as a unitary structure, and wherein, in a plan view, the first protrusions may be spaced apart from each other in first and second directions, the first and second directions intersecting each other; forming a first layer on the support substrate; and separating the support substrate from the first layer.

According to exemplary embodiments of inventive concepts, a semiconductor package may comprise: a semiconductor chip; a mold layer in contact with top and side surfaces of the semiconductor chip, the mold layer having a bottom surface at the same level as that of a bottom surface of the semiconductor chip; and a redistribution layer electrically connected to the semiconductor chip and in contact with the bottom surface of the semiconductor chip and a bottom surface of the mold layer. The bottom surface of the mold layer may be uneven.

DETAILED DESCRIPTION OF EMBODIMENTS

Hereinafter, exemplary embodiments of inventive concepts will be described in detail in conjunction with the accompanying drawings to aid in clearly understanding inventive concepts.

Figure 1:
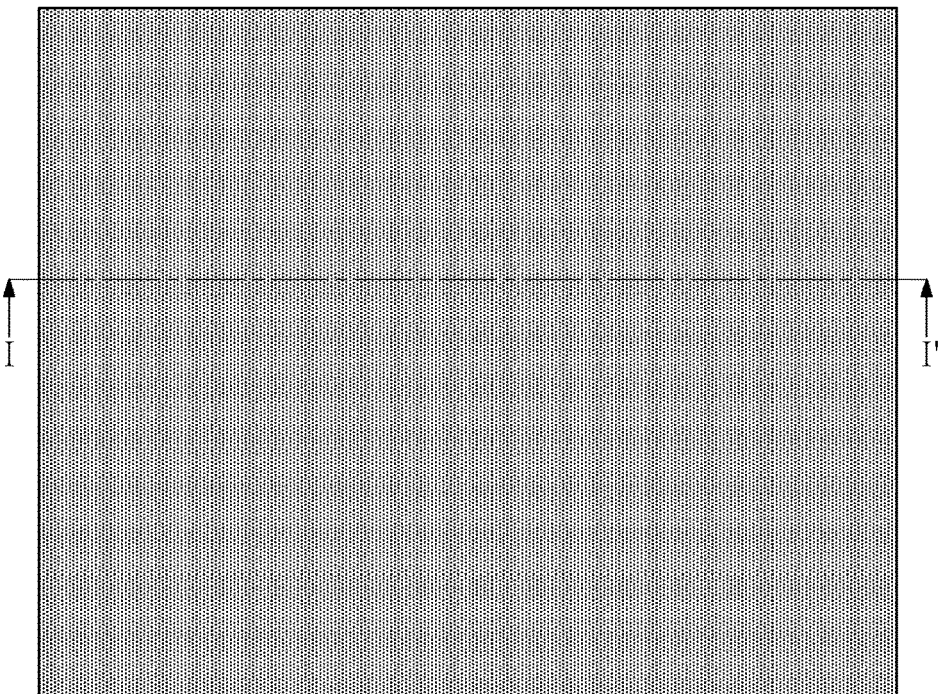
FIG. 1 illustrates a plan view showing a support substrate according to exemplary embodiments of inventive concepts.
Figure 1:
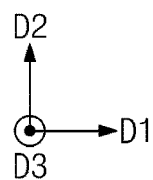
Figure 2:
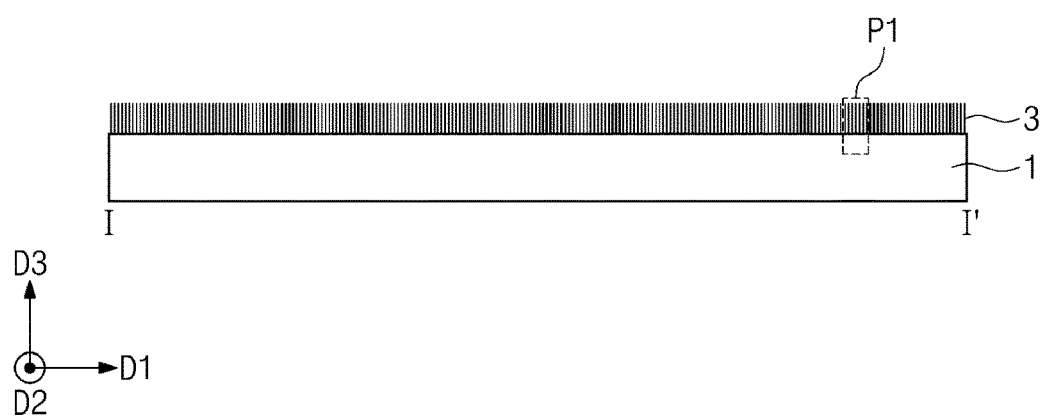
FIG. 2 illustrates a cross-sectional view taken along line I-I' of FIG. 1.
Figure 3:
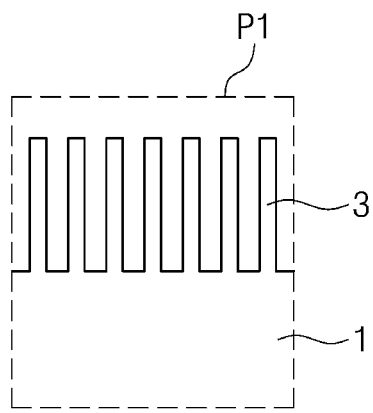
FIG. 3 illustrates an enlarged view showing section P1 of FIG. 2.

FIG. 1 illustrates a plan view showing a support substrate according to exemplary embodiments of inventive concepts. FIG. 2 illustrates a cross-sectional view taken along line I-I' of FIG. 1. FIG. 3 illustrates an enlarged view showing section P1 of FIG. 2.

Referring to FIGS. 1 to 3, a support substrate 10 according to exemplary embodiments may include a main body 1 and first protrusions 3 finely protruding from an upper surface of the main body 1. The first protrusions 3 may be spaced apart from each other in a first direction D1 and a second direction D2, the first and second directions intersecting each other, in a plan view. The first protrusions 3 may protrude in a third direction D3, or a perpendicular direction to first direction D1 and second direction D2. The main body 1 and the first protrusions 3 may include the same material as each other and may be formed as a unitary structure. The support substrate 10 may be used as a support, a carrier, or a sacrificial substrate in manufacturing electronic devices. Each of the first protrusions 3 may have a width of about 1 nm to about 30 μm. A ratio of height to width of each of the first protrusions 3 may be about 10 or higher. The first protrusions 3 may have an arrangement density of at least 500 per unit area (e.g., 1 mm$^2$) on the upper surface of the main body 1. The first protrusions 3 may be arranged at uniform density on an entire upper surface of the main body 1. The support substrate 10 may have a surface structure similar to those of the soles of the feet of a gecko lizard.

FIGS. 4A to 4D illustrate enlarged perspective views showing section P1 of FIG. 2.

Figure 4A:
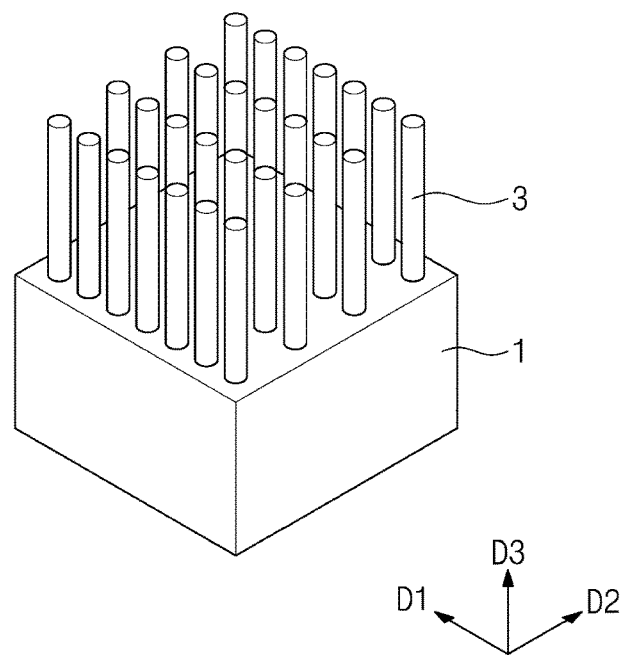
FIGS. 4A to 4D illustrate enlarged perspective views showing section P1 of FIG. 2.
Figure 4B:
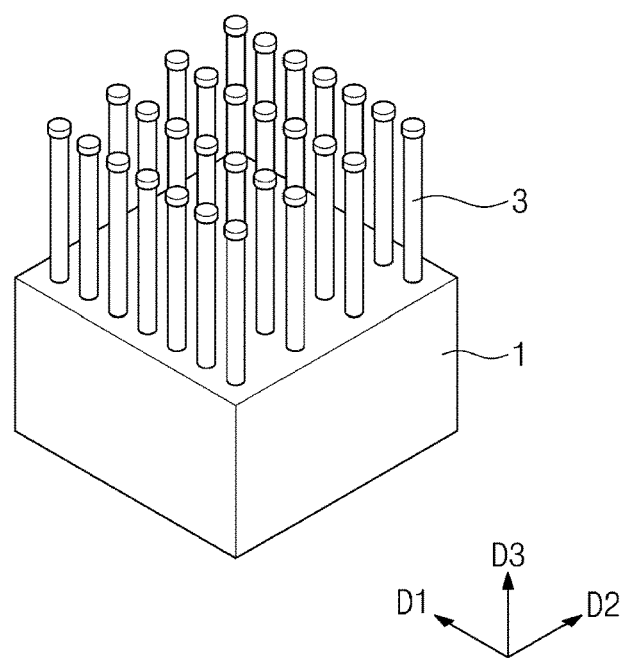
Figure 4C:
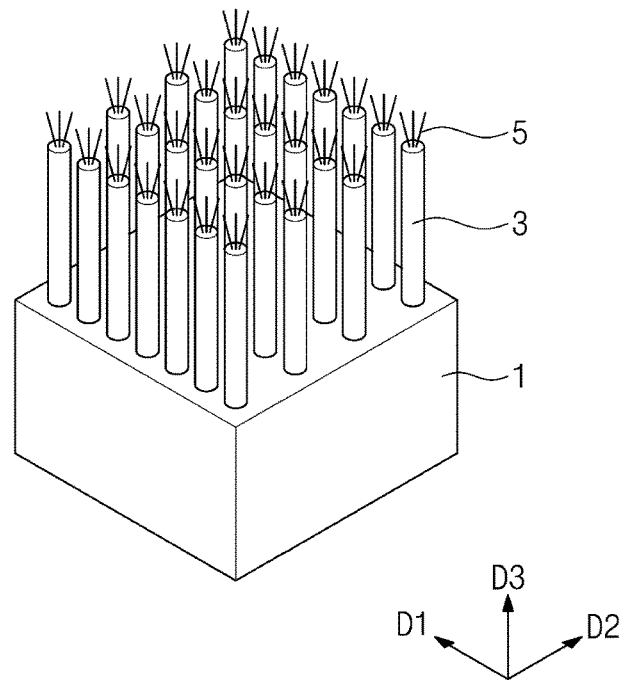
Figure 4D:
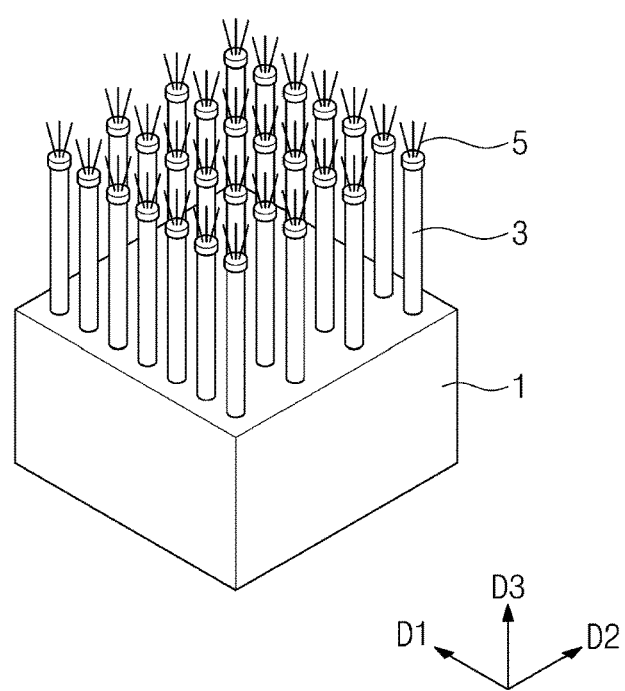

Referring to FIGS. 4A to 4D, the first protrusions 3 may have various shapes. In some embodiments, as illustrated in FIG. 4A, each of the first protrusions 3 may have a cylindrical shape. In other embodiments, as illustrated in FIG. 4B, each of the first protrusions 3 may have a nail shape. For example, the first protrusions 3 may each have an upper portion whose width is greater than that of a lower portion of each of the first protrusions 3. In this case, the upper portion of each of the first protrusions 3 may have a greater surface area exhibiting a reinforced Van der Waals attraction. In other embodiments, as illustrated in FIG. 4C, a plurality of second protrusions 5 may protrude from each of the first protrusions 3. The second protrusions 5 may include the same material as those of the first protrusions 3 and the main body 1. Each of the second protrusions 5 may have a width less than that of each of the first protrusions 3. In the embodiment shown in FIG. 4C, the first and second protrusions 3 and 5 may constitute a hierarchical structure. When the support substrate 10 has the hierarchical structure including the first and second protrusions 3 and 5, an arrangement density of the second protrusions 5 may be at least 500 per unit area (e.g., 1 mm$^2$) on the upper surface of the main body 1. In such a case, the arrangement density of the first protrusions 3 may be less than that of the second protrusions 5. In other embodiments, as illustrated in FIG. 4D, a plurality of the second protrusions 5 may protrude from each of the nail-shaped first protrusions 3, i.e., a combination of shapes shown in FIGS. 4B and 4C. Although not shown, the first protrusions 3 may each have a polygonal or spherical shape.

The main body 1 and the first protrusions 3 of the support substrate 10 may include a material having heat resistance to a temperature of about 200° C. to about 350° C. Alternatively or additionally, the main body 1 and the first protrusions 3 of the support substrate 10 may include a material having light transmittance (or transparency) of about 90% to about 100%. Alternatively or additionally, the main body 1 and the first protrusions 3 of the support substrate 10 may include a material having Young's modulus of about 0.1 MPa to about 100 MPa.

The support substrate 10 may include at least one selected from the group consisting of polydimethyl siloxane, silicon-based rubber, natural rubber, polyisoprene, polysiloxane, polybutadiene, polyacrylamide, polyvinylalcohol, polyacrylic acid, copolymer of polycrylic acid, polyethylene, polypropylene, copolymer of polypropylene, polyester, fluororesin, polyvinylpyrrolidone, carboxyvinyl polymer, poly(hydroxyl methyl cellulose), poly(hydroxyl alkyl methacrylate), copolymer of poly(hydroxyl alkyl methacrylate), poly(ethylene glycol/oxide), copolymer of poly(ethylene glycol/oxide), polyethyleneglycol-polycaprolactone multi-block copolymer, polycaprolactone, copolymer of polycaprolactone, polylactide, copolymer of polylactide, polyglycolide, copolymer of polyglycolide, poly(methyl methacrylate), copolymer of poly(methyl methacrylate), polystyrene, and copolymer of polystyrene.

A package substrate or other layer may be disposed or formed on the support substrate 10, which may fabricate an electronic device. Due to the material and structural characteristics mentioned above, the support substrate 10 may have a good adhesion to a surface of a substance without an adhesive. For example, the material and structural characteristics mentioned above may provide Van der Waals attraction between the first protrusions 3 and a substance provided thereon, such that the support substrate 10 may accomplish an excellent bonding to the substance.

Therefore, when the support substrate 10 is used as a supporting role, a carrier, or a sacrificial substrate, no adhesive may be required so that process addition or defects resulting from the adhesive may be prevented, thereby reducing process costs. For example, when an adhesive is used, it may be needed to provide, remove, and clean the adhesive. In addition, pollution may occur due to a flow of the adhesive, the adhesive may remain even after its removal, and component damages may happen owing to strong adhesion of the adhesive. According to inventive concepts, the support substrate 10 may need no adhesive, and as a result, processes may be simplified and the problems above may be resolved.

The support substrate 10 may be configured such that its surface adhesion becomes different depending on spacing, width, and density of the first protrusions 3. A contact area between the first protrusions 3 and a substance provided thereon may change the surface adhesion of the support substrate 10. For example, the smaller the contact area between the first protrusions 3 and the substance provided thereon, the weaker the surface adhesion of the support substrate 10. The adhesion of the support substrate 10 may be suitably adjusted by selectively changing a surface structure of the support substrate 10, and thus when a substance is separated from the support substrate 10, the substance may be prevented from being damaged.

Figure 5:
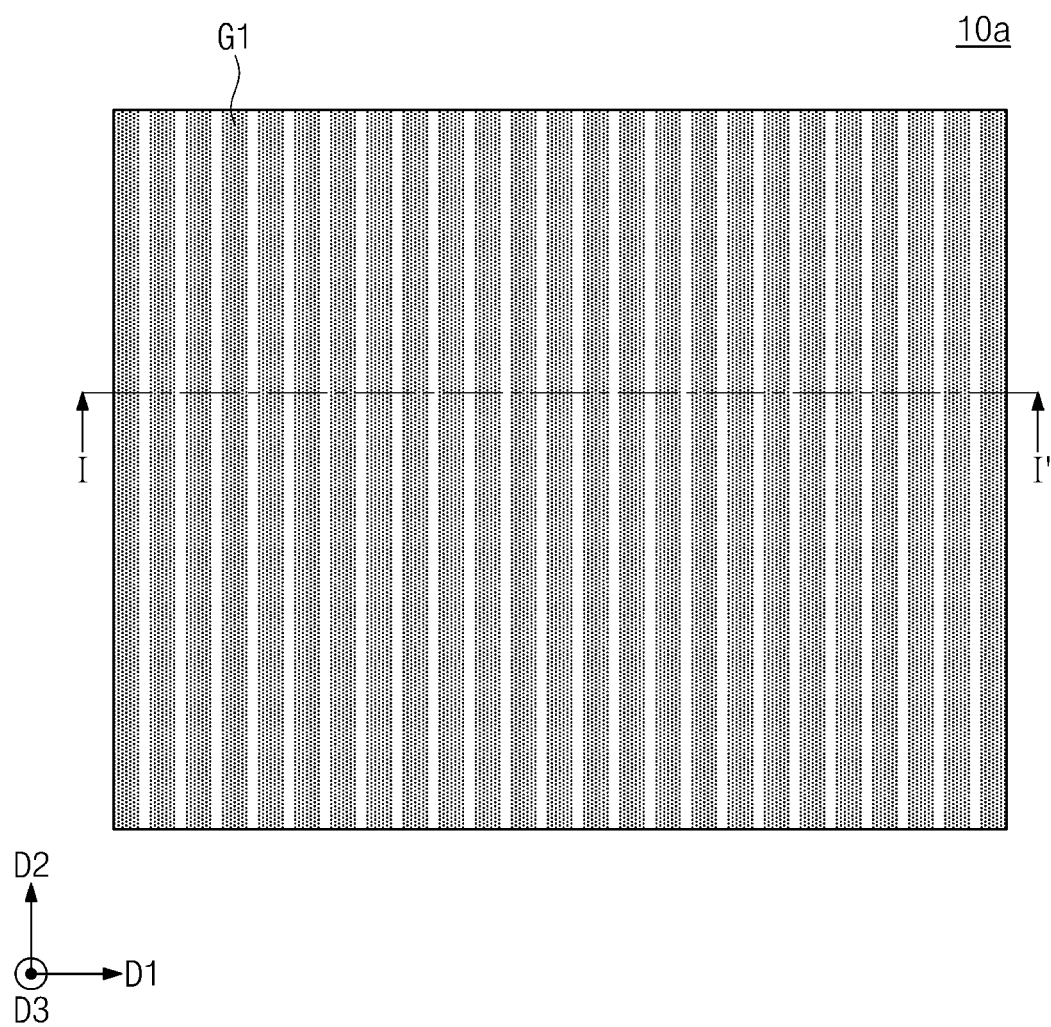
FIGS. 5 and 6 illustrate plan views showing a support substrate according to exemplary embodiments of inventive concepts.
Figure 6:
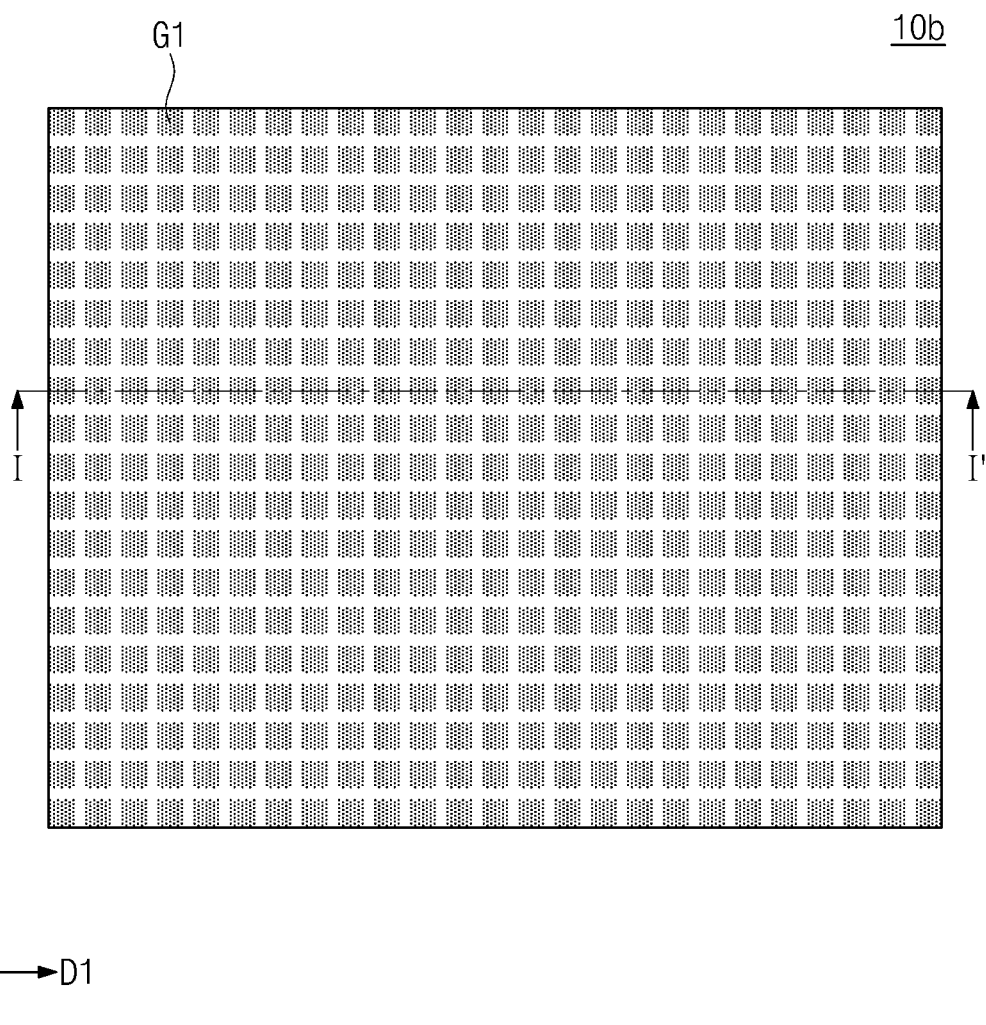
Figure 7:
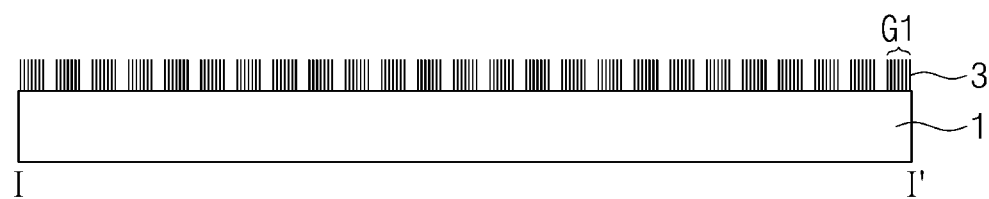
FIG. 7 illustrates a cross-sectional view taken along line I-I' of FIG. 5 or 6.

FIGS. 5 and 6 illustrate plan views showing a support substrate according to exemplary embodiments of inventive concepts. FIG. 7 illustrates a cross-sectional view taken along line I-I' of FIG. 5 or 6.

Referring to FIGS. 5 to 7, the first protrusions 3 may constitute first groups G1. The first groups G1 may be spaced apart from each other. In each of the first groups G1, the first protrusions 3 may have an arrangement density of at least 500 per unit area (e.g., 1 mm$^2$) on the upper surface of the main body 1. No first protrusions 3 may be provided between the first groups G1. The first groups G1 may have linear shapes, when viewed in plan, as illustrated in FIG. 5.

In this case, the first groups G1 may be spaced apart from each other in a first direction D1. Alternatively, as illustrated in FIG. 6, the first groups G1 may have island shapes in the first direction D1 and in a second direction D2 intersecting the first direction D1. Support substrates 10a and 10b may be adjusted in their surface adhesion depending on shapes, areas, spacings, and arrangements of the first groups G1. For example, the surface adhesion of the support substrates 10a and 10b may decrease with a decrease of the areas and/or an increase of the spacings of the first groups G1.

The support substrates 10, 10a, and 10b of FIGS. 1 to 7 may be formed by providing polymer to a frame including fine holes and then curing the polymer. Accordingly, the first protrusions 3 and the main body 1 may be formed as a single unit.

Figure 8:
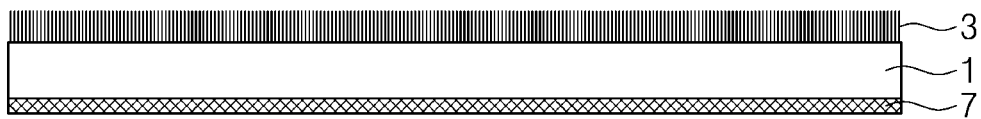
FIGS. 8 to 10 illustrate cross-sectional views showing a support substrate according to exemplary embodiments of inventive concepts.
Figure 9:
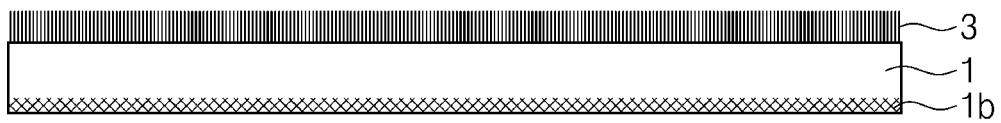
Figure 10:
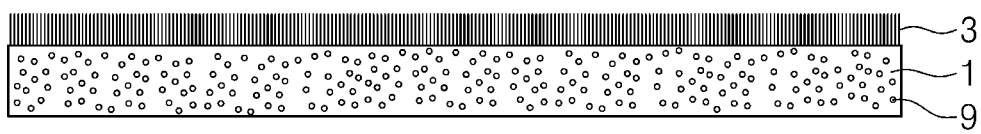

FIGS. 8 to 10 illustrate cross-sectional views showing a support substrate according to exemplary embodiments of inventive concepts.

Referring to FIG. 8, to increase strength of a support substrate 10c, a support layer 7 may be formed on a lower surface of the main body 1 included in the support substrate 10c. The support layer 7 may be formed of a material having Young's modulus greater than the Young's modulus of the first protrusions 3 and the main body 1. The material of the support layer 7 may be different from those of the main body 1 and the first protrusions 3. The support layer 7 may include at least one selected from the group consisting of polyester-based polymer (e.g., polyethylene terephthalate (PET), polybutylene terephthalate (PBT), polyethylene naphthalate (PEN), polytrimethylene terephthalate (PTT), polycyclohexylene terephthalate (PCT), etc.), fluororesin-based polymer (e.g., polytetrafluoroethylene (PTFE), ethylene tetrafluoroethylene (ETFE), fluorinated ethylene propylene (FEP), etc.), engineering plastic-based polymer (e.g., polyphenylene sulfide (PPS), polyarylate (PAR), polyether ether ketone (PEEK), polyimide (PI), etc.), and any copolymer thereof, but inventive concepts are not limited thereto. The support layer 7 may include a material having heat resistance to a temperature of about 200° C. to about 350° C. Alternatively or additionally, the support layer 7 may include a material having light transmittance of about 90% to about 100%. A coating, adhesion, or lamination process may be performed to form the support layer 7 on the lower surface of the support substrate 10c.

Referring to FIG. 9, to increase strength of a support substrate 10d, a support layer 1b may be formed on a lower surface of the main body 1 included in the support substrate 10d. The support layer 1b may be formed by irradiating ultraviolet light onto a portion of the main body 1 and then curing the portion of the main body 1. The support layer 1b may be formed of the same material as those of the main body 1 and the first protrusions 3, but may have different Young's modulus from that of the main body 1 and the first protrusions 3.

Referring to FIG. 10, to increase strength of a support substrate 10e, filler particles 9 may be distributed in the main body 1 of the support substrate 10e. The filler particles 9 may be or include inorganic particles. For example, the filler particles 9 may be or include one or more of silica, alumina, titanium oxide, zinc oxide, and manganese oxide. The filler particles 9 may have a thermal expansion coefficient less than that of the main body 1, preventing deformation of the support substrate 10e. The filler particles 9 may have Young's modulus greater than that of the main body 1, increasing strength of the support substrate 10e.

The following discusses a method of fabricating an electronic device using the support substrate 10 of FIG. 1.

FIGS. 11 to 16 illustrate cross-sectional views showing a method of fabricating a semiconductor package according to exemplary embodiments of inventive concepts.

Figure 11:
FIGS. 11 to 16 illustrate cross-sectional views showing a method of fabricating a semiconductor package according to exemplary embodiments of inventive concepts.

Referring to FIG. 11, a support substrate 10 may be prepared. The support substrate 10 may be identical or similar to that discussed above, in terms of material, physical property, and surface structure. The support substrate 10 may have, for example, a panel size.

Figure 12:
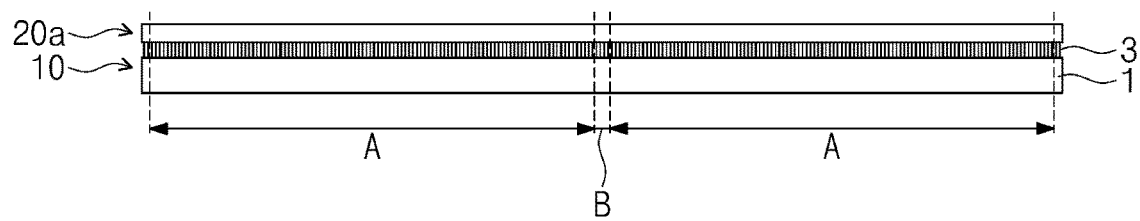
Figure 13:
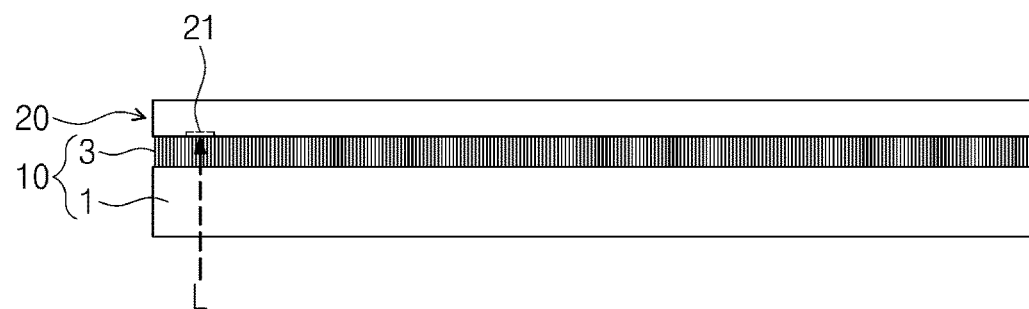

Referring to FIGS. 12 and 13, a package panel 20a may be placed on the support substrate 10. The package panel 20a may be or include a printed circuit board panel. The package panel 20a may have the panel size, likewise the support substrate 10. The package panel 20a may adhere onto the first protrusions 3 of the support substrate 10 by Van der Waals attraction. A second region B of the package panel 20a and the support substrate 10 may be removed, but a first region A of the package panel 20a and the support substrate 10 may remain, thereby forming a package substrate 20 having a PCB (printed circuit board) size. In this step, as the package panel 20a and the support substrate 10 are cut at the same time, sidewalls of the package substrate 20 may align with sidewalls of the support substrate 10.

Referring to FIG. 13, an identification structure 21 may be provided on a bottom surface of the package substrate 20. The identification structure 21 may be or include a product serial number or a bar code. The identification structure 21 may be recognized by light L irradiated onto the lower surface of the support substrate 10. This may be possible due to the fact that the support substrate 10 has light transmittance of about 90% to about 100%. The package substrate 20 may have a thickness of about 80 μm or less. The package substrate 20 may include no core (or glass fiber) therein. When no support substrate 10 is provided, the package substrate 20 may suffer from warpage or sag as a result of its small thickness. The support substrate 10 may solve the problems above. The package substrate 20 of FIG. 13 may include conductive patterns, conductive pads, and insulating layers on top and bottom surfaces of the package substrate 20, in addition to the identification structure 21.

Figure 14:
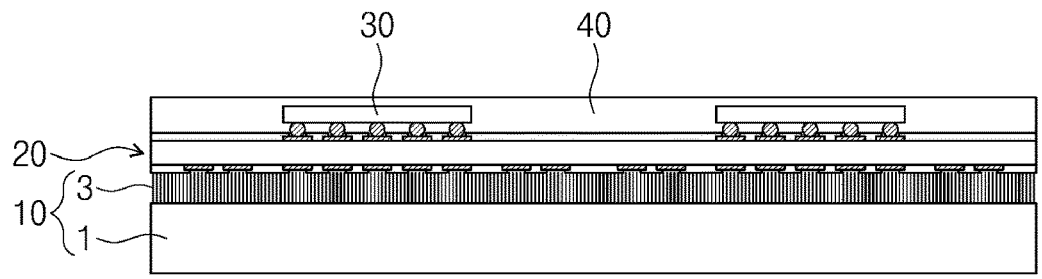

Referring to FIG. 14, a plurality of semiconductor chips 30 may be mounted on the package substrate 20. The semiconductor chips 30 may be mounted, for example, in a flip-chip bonding manner. A mold layer 40 may be formed to cover the semiconductor chips 30 and the package substrate 20. The mold layer 40 may be formed of, for example, an epoxy-based material. As the sidewalls of the package substrate 20 align with the sidewalls of the support substrate 10, the support substrate 10 may be easily received into a mold frame that forms the mold layer 40, thereby facilitating the formation of the mold layer 40.

Figure 15:
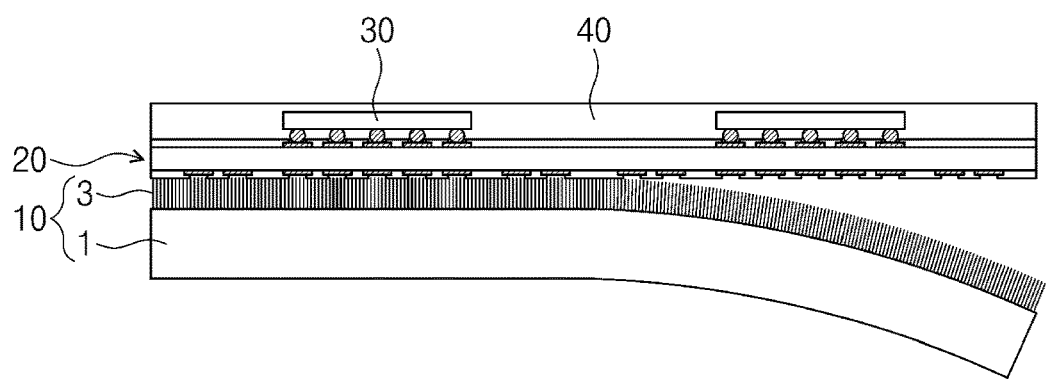

Referring to FIG. 15, the support substrate 10 may be separated from the bottom surface of the package substrate 20. Vacuum may be used to pull a side bottom surface of the support substrate 10 to separate the support substrate 10 from the package substrate 20. Because no adhesive is provided on a surface of the support substrate 10, the support substrate 10 may be easily separated by a relatively small force but larger than Van der Waals attraction.

Figure 16:
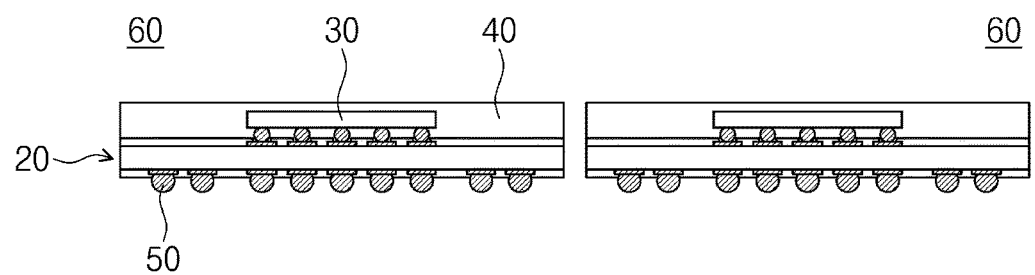

Referring to FIG. 16, external terminals 50 such as solder balls may be formed on the bottom surface of the package substrate 20, the bottom surface of which may also include conductive patterns, conductive pads, and insulating layers thereon, and then a singulation process may be performed to cut the mold layer 40 and the package substrate 20 into unit package-sized pieces, which may fabricate unit semiconductor packages 60.

FIGS. 17, 18A, 19, 20, and 21A illustrate cross-sectional views showing a method of fabricating a semiconductor package according to exemplary embodiments of inventive concepts. FIG. 18B illustrates an enlarged cross-sectional view showing section P2 of FIG. 18A. FIG. 21B illustrates an enlarged cross-sectional view showing section P3 of FIG. 21A.

Figure 17:
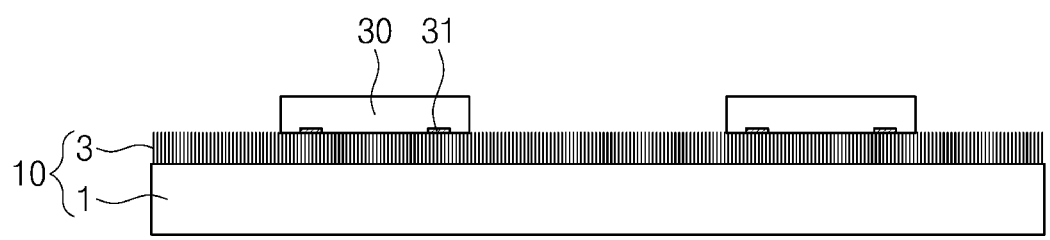
FIGS. 17, 18A, 19, 20, and 21A illustrate cross-sectional views showing a method of fabricating a semiconductor package according to exemplary embodiments of inventive concepts.

Referring to FIG. 17, a plurality of semiconductor chips 30 may be placed on the support substrate 10. The semiconductor chips 30 may include chip terminals 31. The chip terminals 31 may lie adjacent to the support substrate 10.

Figure 18A:
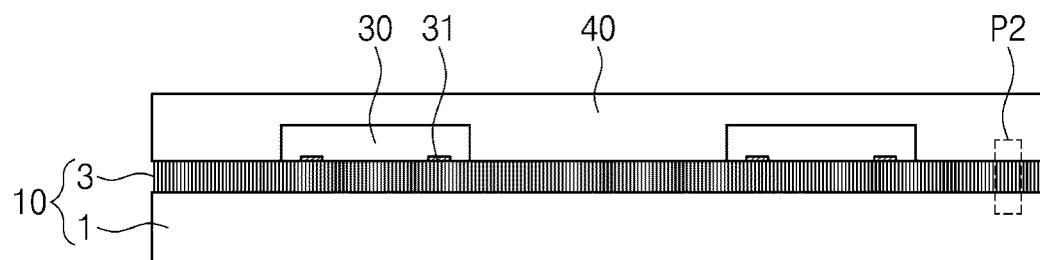
Figure 18B:
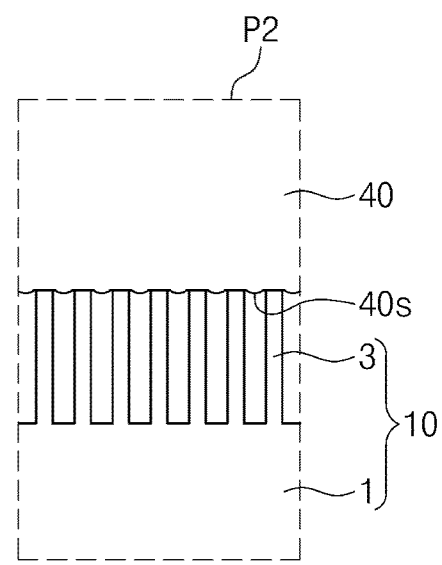
FIG. 18B illustrates an enlarged cross-sectional view showing section P2 of FIG. 18A.

Referring to FIGS. 18A and 18B, a mold layer 40 may be formed to cover the semiconductor chips 30 and the support substrate 10. A resin solution may be introduced into a mold frame on which the support substrate 10 of FIG. 17 is loaded, and then heat may be provided to cure the resin solution, thereby forming the mold layer 40. A high viscosity of the resin solution and a fine spacing between the first protrusions 3 may prevent the resin solution from entering between the first protrusions 3. In addition, fineness of the first protrusions 3 may cause the support substrate 10 to have a surface structure exhibiting a super-hydrophobic property that prevents the resin solution from entering between the first protrusions 3. The first protrusions 3 may cause the mold layer 40 to have an uneven surface 40s. As the support substrate 10 has heat resistance to a temperature of about 200° C. to about 350° C., the support substrate 10 may not be damaged when the mold layer 40 is formed.

Figure 19:
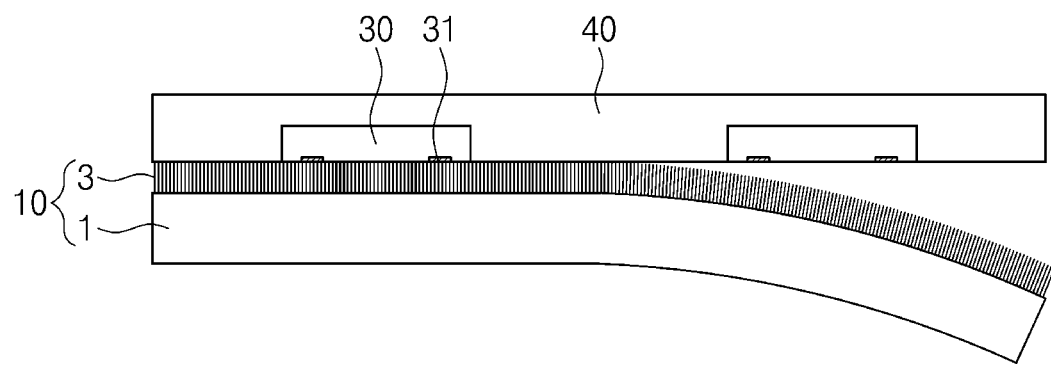

Referring to FIG. 19, the support substrate 10 may be separated from the mold layer 40 and the semiconductor chips 30. The separation of the support substrate 10 may be identical or similar to that discussed with reference to FIG. 15.

Figure 20:
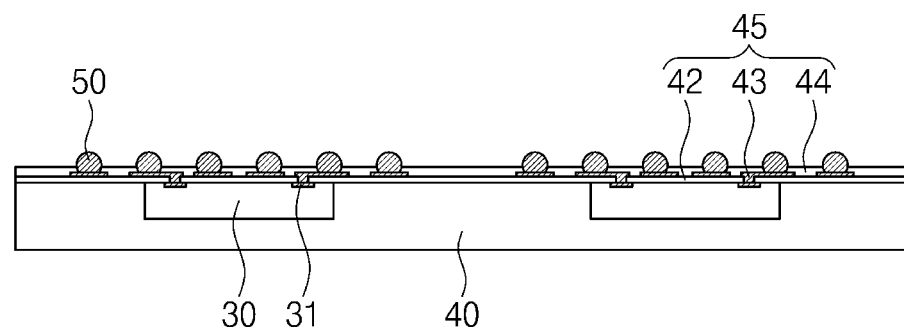

Referring to FIG. 20, when the support substrate 10 is separated, the semiconductor chips 30 and the mold layer 40 may be turned upside down to bring the chip terminals 31 to face upward. A redistribution layer 45 may be formed on the mold layer 40 and the semiconductor chips 30. The redistribution layer 45 may include a first insulating layer 42 in contact with the semiconductor chips 30 and the mold layer 40, a redistributed pattern 43 penetrating the first insulating layer 42 to come into connection with the chip terminals 31, and a second insulating layer 44 covering the redistributed pattern 43 and the first insulating layer 42. The first and second insulating layers 42 and 44 may be formed of an insulating material such as silicon oxide, silicon nitride, or polyimide. The redistributed pattern 43 may be formed of a conductive material such as copper. External terminals 50 may be bonded onto some of the redistributed pattern 43.

Figure 21A:
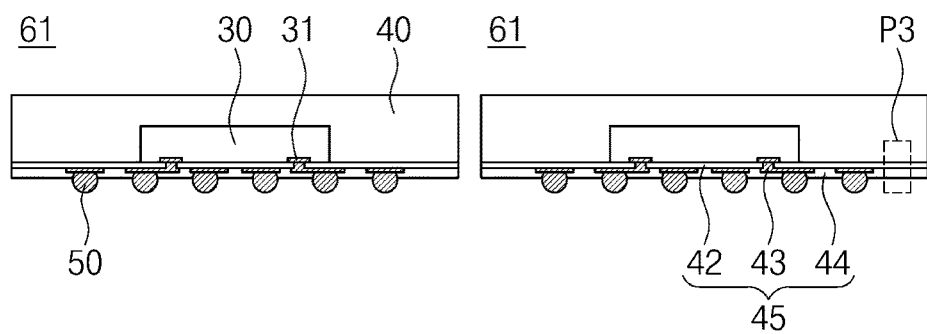
Figure 21B:
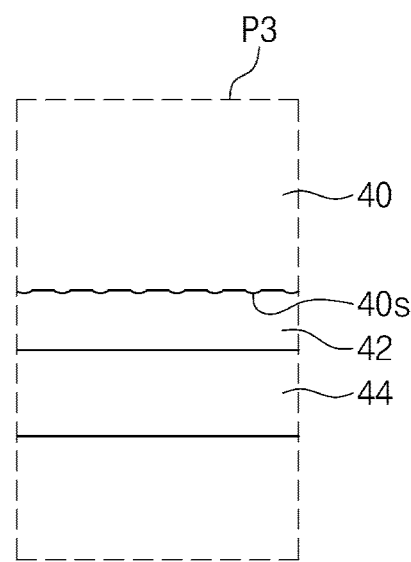
FIG. 21B illustrates an enlarged cross-sectional view showing section P3 of FIG. 21A.

Referring to FIGS. 21A and 21B, a singulation process may be performed to cut the mold layer 40 and the redistributed 45 into unit package-sized pieces, thereby forming unit semiconductor packages 61. The unit semiconductor package 61 may be a fan-out level semiconductor package. The unit semiconductor package 61 may be configured such that the mold layer 40 has the uneven surface 40s in contact with the first insulating layer 42. This may be accomplished by the process of forming the mold layer 40 discussed with reference to FIGS. 18A and 18B.

Figure 22:
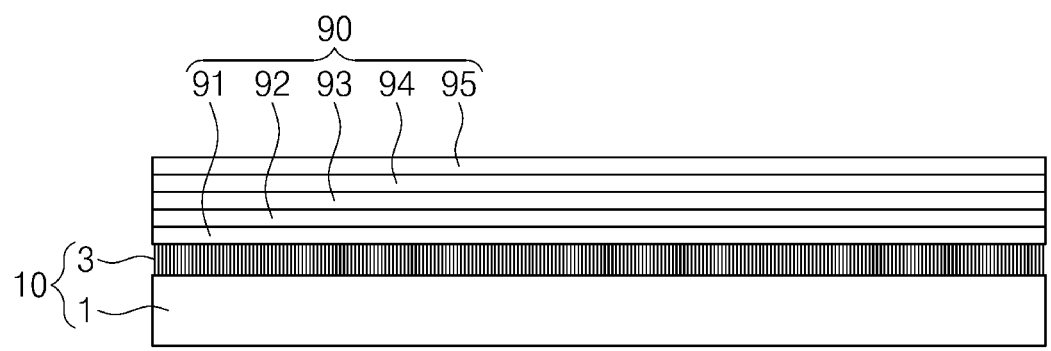
FIGS. 22 and 23 illustrate cross-sectional views showing a method of fabricating a solar cell according to exemplary embodiments of inventive concepts.
Figure 23:
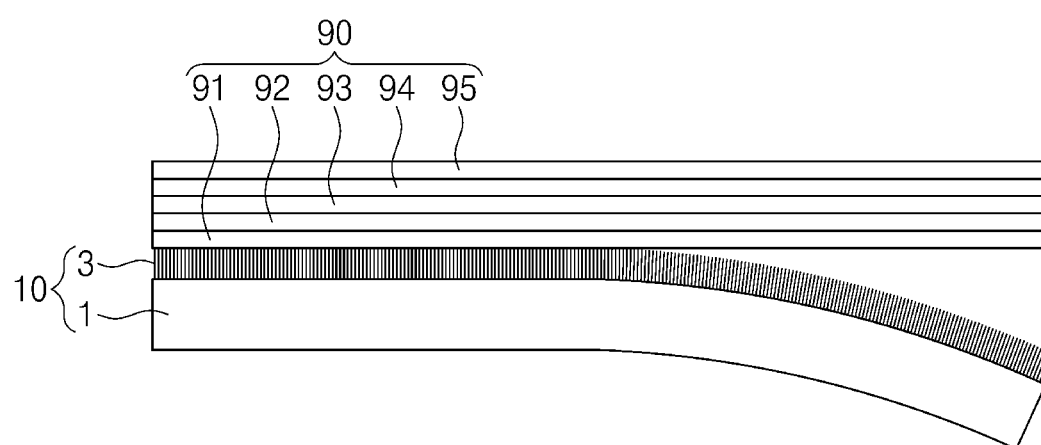

FIGS. 22 and 23 illustrate cross-sectional views showing a method of fabricating a solar cell according to exemplary embodiments of inventive concepts.

Referring to FIG. 22, a solar cell 90 may be formed by sequentially forming a first protection layer 91, a first electrode layer 92, a solar cell layer 93, a second electrode layer 94, and a second protection layer 95 on the support substrate 10. The first and second protection layers 91 and 95 may be formed of, for example, a flexible transparent polyimide layer. The first and second electrode layers 92 and 94 may be formed of, for example, a transparent ITO layer. The solar cell layer 93 may include, for example, a light-absorption layer and a buffer layer that are sequentially stacked. The light-absorption layer may be formed of $Cu(In-Ga)Se_2$. The buffer layer may be formed of CdS or ZnS.

Referring to FIG. 23, the support substrate 10 may be separated from the solar cell 90. As a result, a flexible solar cell 90 may be fabricated.

The fabrication of an electronic device using the support substrate 10 may not be limited to the description above, but may be variously modified.

According to inventive concepts, Van der Waals attraction may be used for adhesion of the support substrate, and as a result, the support substrate may serve as a supporting role, a carrier, or a sacrificial substrate to simplify processes, to save process cost, and to reduce process defects in manufacturing semiconductor packages or electronic devices.

What is claimed is:
1. A support substrate, comprising:
   a main body;
   a support layer is formed on a lower surface of the main body; and
   a plurality of protrusions protruding from an upper surface of the main body,
   wherein the main body, the support layer and the plurality of protrusions comprise the same material, and
   the main body and the plurality of protrusions are formed as a unitary structure, and
   wherein, in a plan view, the plurality of protrusions are spaced apart from each other in first and second directions to bond the plurality of protrusions with an object provided on the plurality of protrusions with a nail shape.

2. The support substrate of claim 1, further comprising a plurality of second protrusions protruding from a top end of each of the first protrusions,
   wherein each of the second protrusions has a width less than a width of each of the first protrusions.

3. The support substrate of claim 1, further comprising filler particles distributed in the main body but not present in the first protrusions.

4. The support substrate of claim 3, wherein the filler particles comprise one or more of silica, alumina, titanium oxide, zinc oxide, and manganese oxide.

5. The support substrate of claim 1, wherein the material comprises at least one selected from the group consisting of polydimethyl siloxane, silicon-based rubber, natural rubber, polyisoprene, polysiloxane, polybutadiene, polyacrylamide, polyvinylalcohol, polyacrylic acid, copolymer of polycrylic acid, polyethylene, polypropylene, copolymer of polypropylene, polyester, fluororesin, polyvinylpyrrolidone, carboxyvinylpolymer, poly(hydroxyl methyl cellulose), poly(hydroxyl alkyl methacrylate), copolymer of poly(hydroxyl alkyl methacrylate), poly(ethylene glycol/oxide), copolymer of poly(ethylene glycol/oxide), polyethyleneglycol-polycaprolactone multi-block copolymer, polycaprolactone, copolymer of polycaprolactone, polylactide, copolymer of polylactide, polyglycolide, copolymer of polyglycolide, poly(methyl methacrylate), copolymer of poly(methyl methacrylate), polystyrene, and copolymer of polystyrene.

6. The support substrate of claim 1, wherein a ratio of height to width of each of the first protrusions is 10 or higher.

7. The support substrate of claim 1, wherein the material has heat resistance to a temperature of 200° C. to 350° C.

8. The support substrate of claim 1, wherein the material has light transmittance of about 90% to about 100%.

9. The support substrate of claim 1, wherein the first protrusions aggregate to constitute groups, the groups being spaced apart from each other.

10. The support substrate of claim 9, wherein, in a plan view, the groups have linear or island shapes.

11. A support substrate, comprising:
a main body;
a support layer is formed on a lower surface of the main body; and
a plurality of protrusions protruding from an upper surface of the main body,
wherein the main body, the support layer and the plurality of protrusions comprise the same material, and
the main body and the plurality of protrusions are formed as a unitary structure, and
wherein, in a plan view, the plurality of protrusions are spaced apart from each other in first and second directions to bond the plurality of protrusions with an object provided on the plurality of protrusions.

12. The support substrate of claim 11, wherein each of the first protrusions comprises an upper portion and a lower portion, the upper portion having a width greater than a width of the lower portion.

13. The support substrate of claim 11, wherein each of the first protrusions has a cylindrical shape, a polygonal shape, or a spherical shape.

14. The support substrate of claim 11, further comprising a plurality of second protrusions protruding from a top end of each of the first protrusions, wherein each of the second protrusions has a width less than a width of each of the first protrusions.

15. The support substrate of claim 11, further comprising filler particles distributed in the main body but not present in the first protrusions.

16. A support substrate, comprising:
a main body;
a support layer is formed on a lower surface of the main body; and
a plurality of protrusions protruding from an upper surface of the main body,
wherein the main body and the plurality of protrusions comprise the same material, and
the main body and the plurality of protrusions are formed as a unitary structure, and
wherein, in a plan view, the plurality of protrusions are spaced apart from each other in first and second directions to bond the plurality of protrusions with an object provided on the plurality of protrusions with a nail shape.

17. The support substrate of claim 16, wherein the support layer has a Young's modulus greater than a Young's modulus of the main body and the first protrusions.

18. The support substrate of claim 16, wherein the support layer has light transmittance of about 90% to about 100%.

19. The support substrate of claim 16, wherein the support layer comprises a material different from a material of the main body, or is formed of a cured portion of the main body.

20. The support substrate of claim 16, further comprising filler particles distributed in the main body but not present in the first protrusions.

* * * * *